United States Patent [19]

Nishizawa

[11] Patent Number: 4,608,587

[45] Date of Patent: Aug. 26, 1986

[54] SEMICONDUCTOR OPTOELECTRO TRANSDUCER

[75] Inventor: Jun-ichi Nishizawa, Sendai, Japan

[73] Assignee: "Semiconductor Research Foundation", Japan

[21] Appl. No.: 522,307

[22] PCT Filed: Nov. 30, 1982

[86] PCT No.: PCT/JP82/00457

§ 371 Date: Jul. 29, 1983

§ 102(e) Date: Jul. 29, 1983

[87] PCT Pub. No.: WO83/02037

PCT Pub. Date: Jun. 9, 1983

[51] Int. Cl.$^4$ .................. H01L 27/14; H01L 31/00
[52] U.S. Cl. ................................................. 357/30
[58] Field of Search ......................................... 357/30

[56] References Cited

U.S. PATENT DOCUMENTS 4,427,990  1/1984  Nishizawa ..................... 357/30

Primary Examiner—William L. Sikes
Assistant Examiner—Robert E. Wise
Attorney, Agent, or Firm—McGlew and Tuttle

[57] ABSTRACT

The present invention has for its object to make a semiconductor optoelectro transducer higher-speed and higher-sensitivity. To this end, a field effect transistor, static induction transistor or static induction thyristor is used as a basic element and at least one portion of the gate region is exposed at the wafer surface.

2 Claims, 20 Drawing Figures

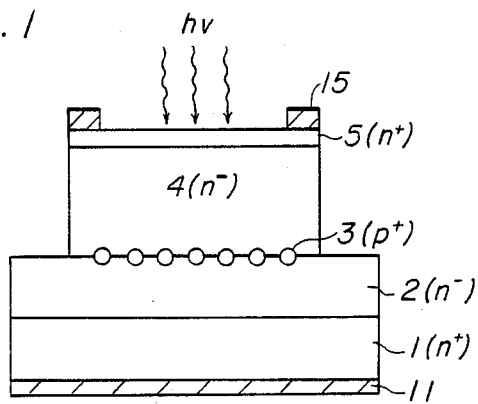
FIG. 1
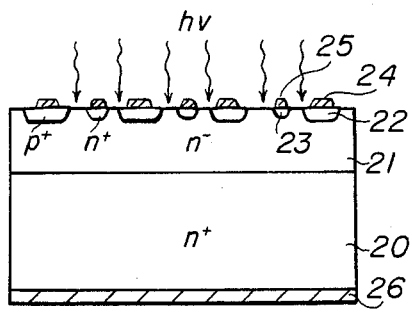
FIG. 2 (A)
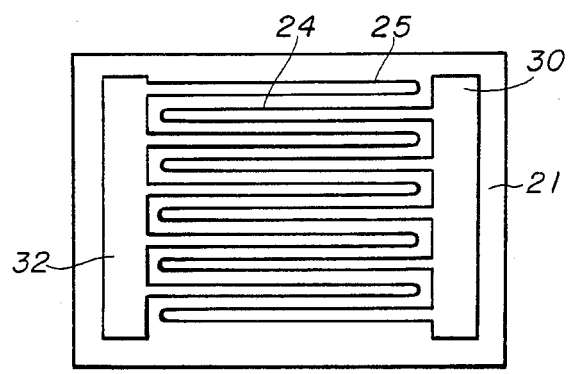
(B)

FIG. 11
(A)
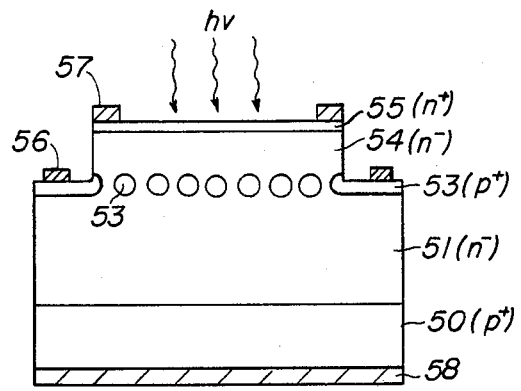
(B)
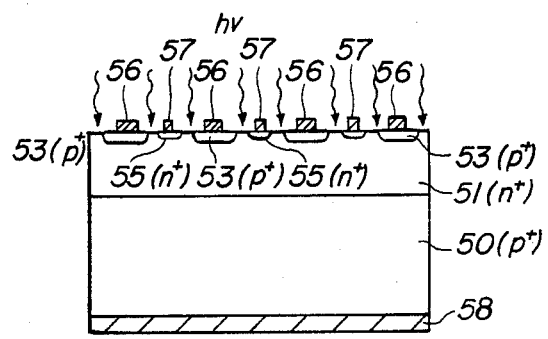
(C)
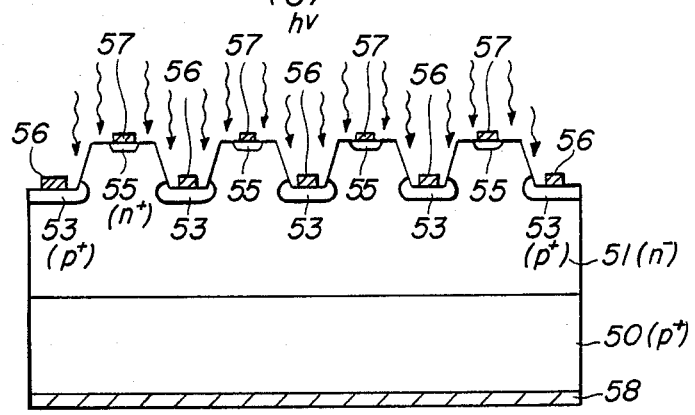

(D)

(A)          (B)

FIG. 13
(A)
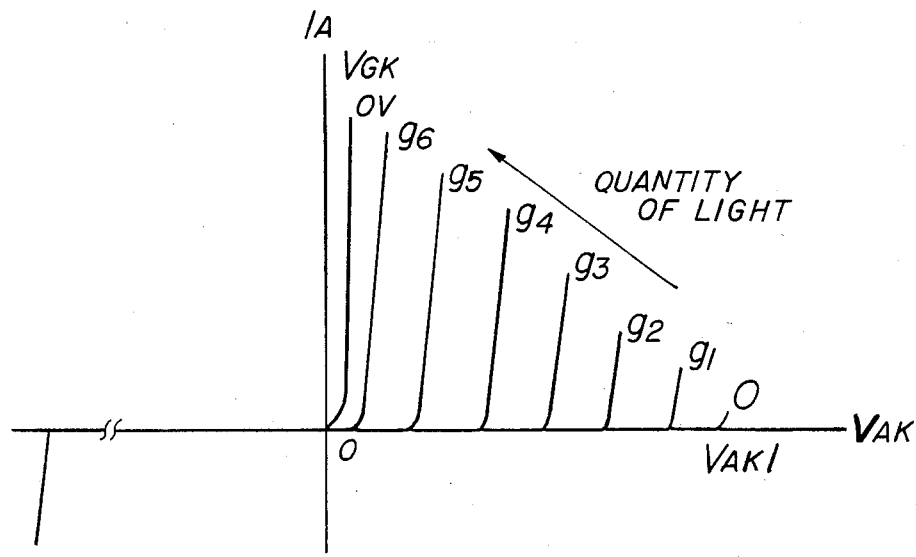
(B)
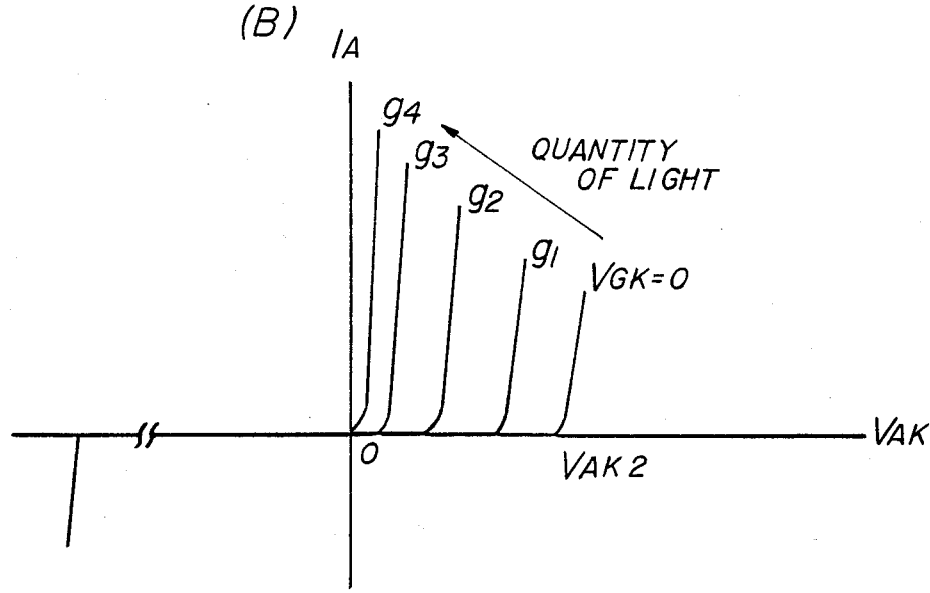

FIG. 14
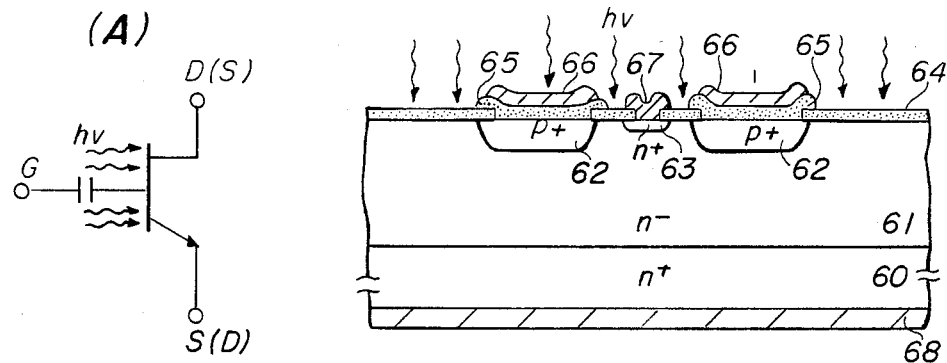
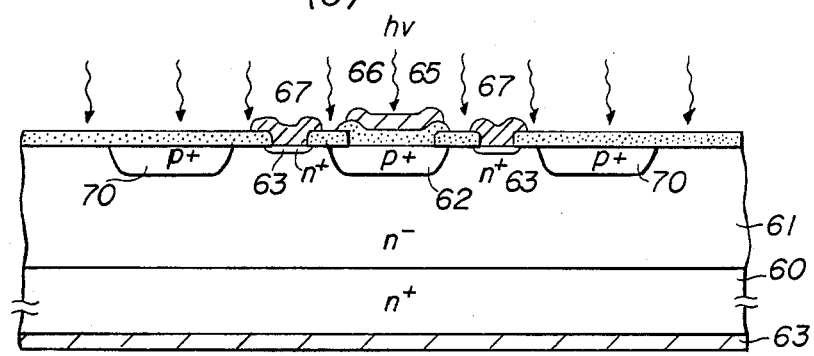
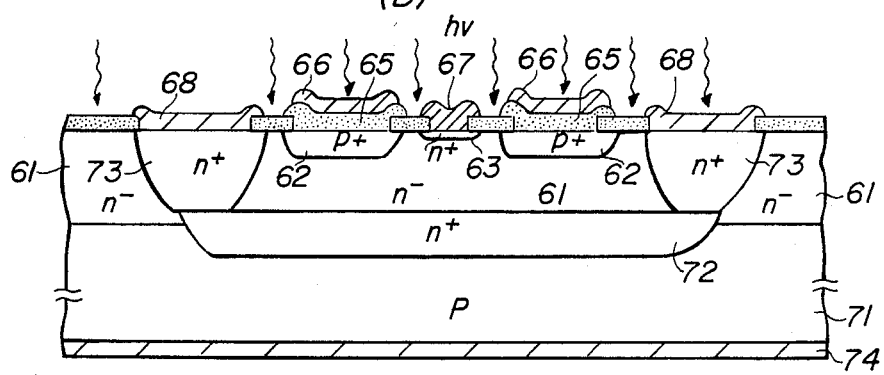

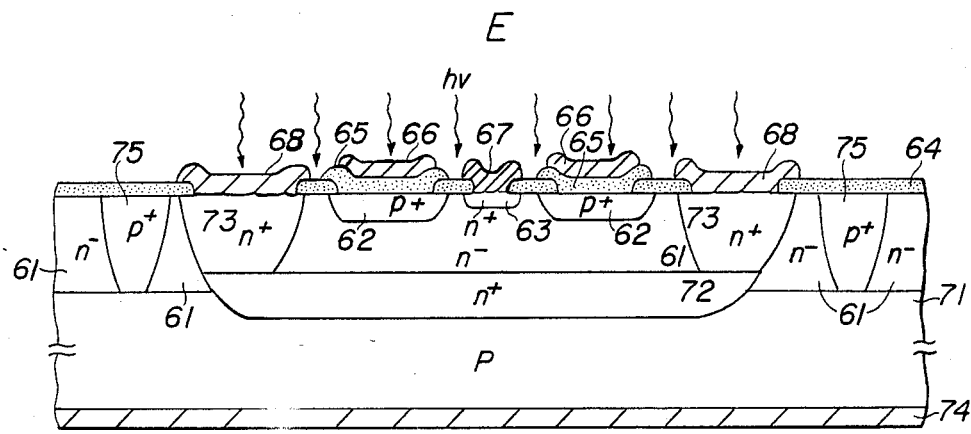
FIG. 14
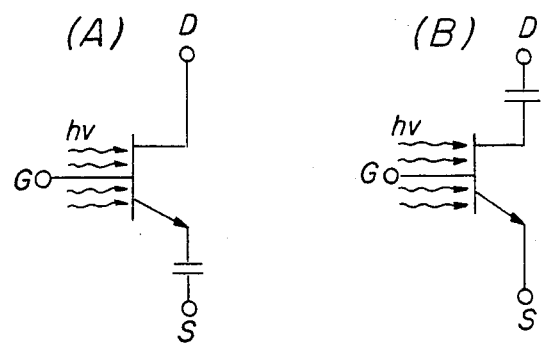
FIG. 15
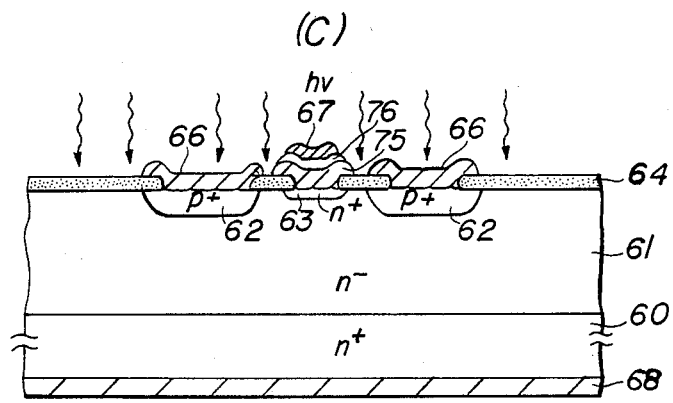

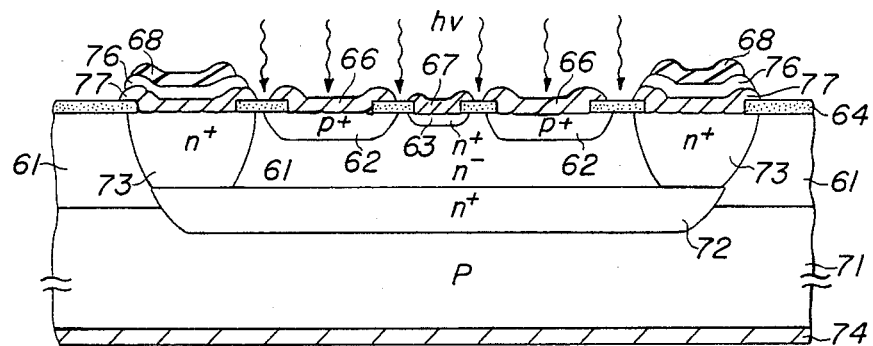
FIG. 15 (D)
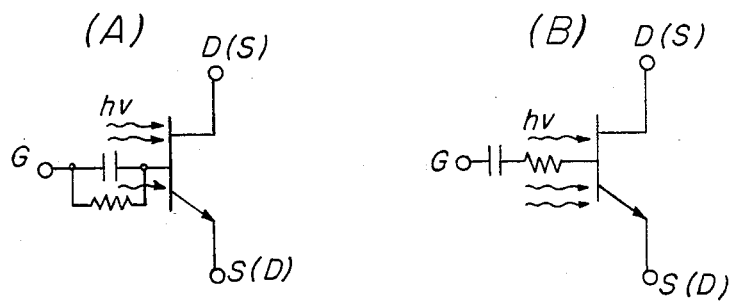
FIG. 16
(A)
(B)
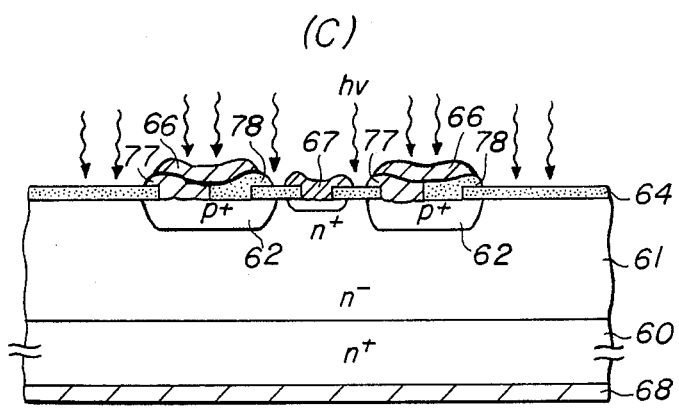
(C)

FIG. 16
(D)
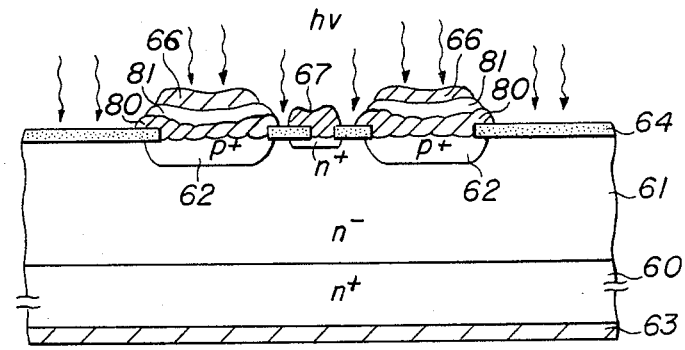
FIG. 17
(A)
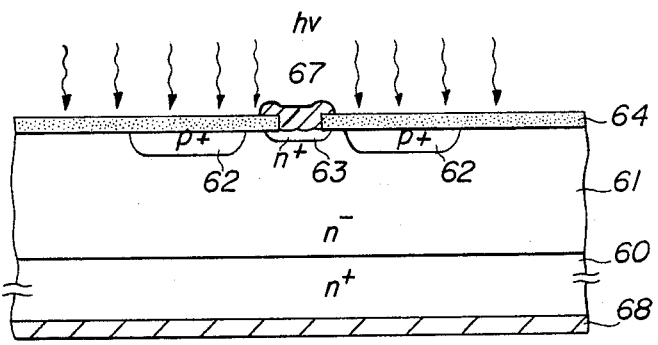
(B)
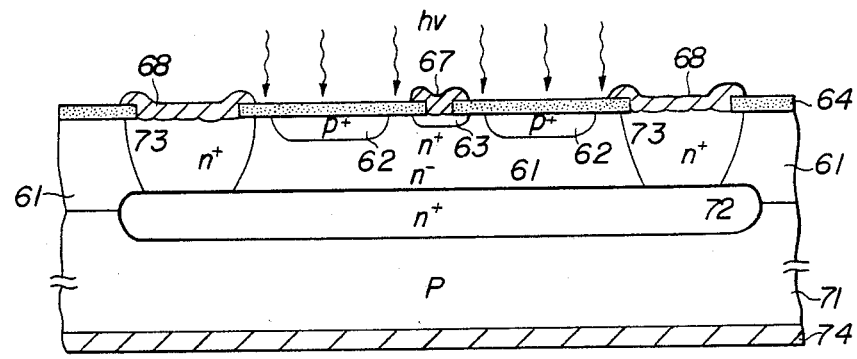

FIG.18 (A)
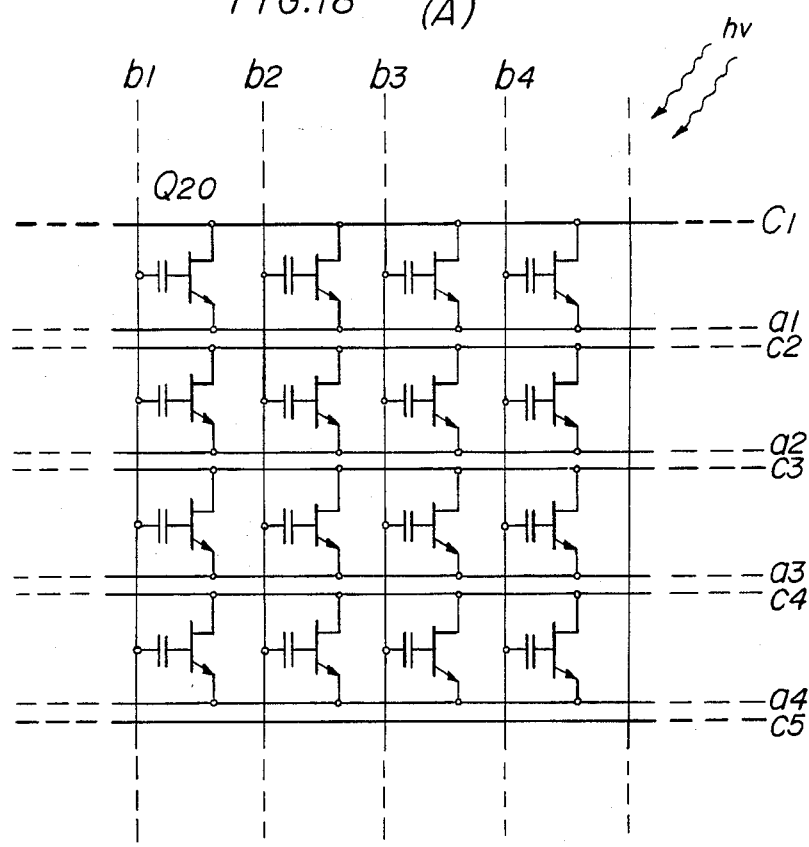
(B)
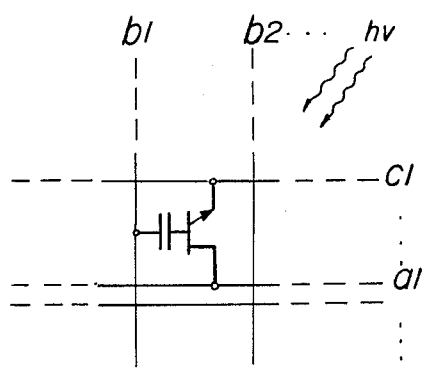

FIG. 19 (A)
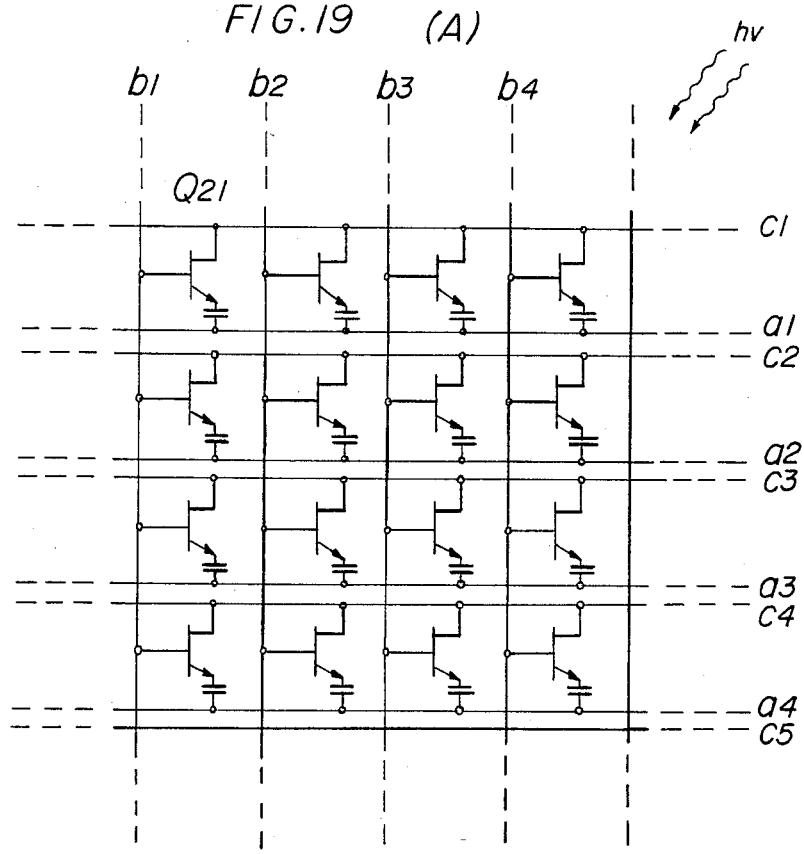
(B)
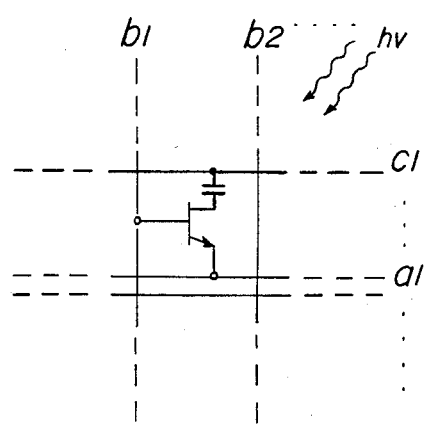

SEMICONDUCTOR OPTOELECTRO TRANSDUCER

TECHNICAL FIELD

The present invention relates to a semiconductor optoelectro transducer.

TECHNICAL BACKGROUND

Conventional semiconductor optoelectro transducers are known such as photoconductive photosensors, photo diodes and photo transistor etc. The photo transistors has the same structure as a conventional bipolar transistor and stores carriers created by light in its base region to control an emitter current.

The conventional bipolar type photo transistor is poor in sensitivity and has a serious defect in that an increase in the light receiving area, to raise its sensitivity, reduces its frequency characteristic. On account of this, for example, as a detector for optical communication a p-i-n photo diode or an avalanche diode is chiefly used, which produces much more noise than the photo transistor. As a high-sensitivity detector for various physical measurements, a photomultiplier is used but this possesses grave defects in that it usually calls for a high voltage of above 1000 V and is short-lived.

In the case of the bipolar type photo transistor, since there are two kinds of carriers which contribute to the main current, i.e. electrons and holes, the minority carrier storage effect is produced and the response speed cannot be raised high but is several tens of kilohertz at the highest.

By the way, the present inventor's proposed static induction transistor, which exhibits an unsaturable type current-voltage characteristic (Japanese Pat. No. 968336), has resulted in various advantages. Furthermore, a semiconductor optoelectro transducer similar to the present invention has been proposed by the present inventor in Japanese Pat. Pub. Disc. No. 13924/80.

The semiconductor optoelectro transducer of the present invention is a higher-sensitivity and higher-speed semiconductor optoelectro transducer than those heretofore proposed.

FIG. 1 shows one of the semiconductor optoelectro transducers proposed in the abovesaid Pat. Pub. Disc. No. 13924/80, which is an example in which a junction gate type static induction transducer is employed and light is applied through the n+ drain region 5 to the n channel regions 2, 4.

Reference numeral 1 indicates an n+ substrate, 2 and 4 high resistivity n− layers of the channel, 3 a p+ region of the gate, 5 an n+ layer of the drain, 15 a drain electrode and 11 a source electrode.

As already clarified by the present inventor, the characteristic of the static induction transistor (hereinafter referred to as SIT) can be made variable by changing the impurity density of the channel and the shape and spacing of the p+ gates. The present invention is applicable to either of the SIT and a field effect transistor (hereinafter referred to as FET).

But the device shown in FIG. 1 has the drawback that holes take time to reach the gate since the gate region is buried in the channel. The buried type gate is defective in that electrostatic capacitances between the gate and the source and between the gate and the drain are large, resulting in impaired frequency characteristic.

DISCLOSURE OF THE INVENTION

An object of the present invention is to provide a semiconductor optoelectro transducer using a field effect transistor, static induction transistor or static induction thyristor of higher speed and higher sensitivity than the conventional photo transistor.

Another object of the present invention is to provide an improved semiconductor optoelectro transducer which has obviated the defect of the device shown in FIG. 1.

The semiconductor optoelectro transducer of the present invention comprises a channel region of a low impurity density semiconductor of one conductivity type or of an intrinsic semiconductor, two main electrode regions provided adjacent the channel region, for flowing a main current, and gate regions of such shapes as not to close the channel; at least one portion of each gate region is exposed at the wafer surface; a predetermined portion of the channel region is provided with a light receiving portion for receiving light; and a portion is provided in which a depletion layer in the vicinity of an inherent gate in the channel region is controlled by the quantity of light incident on the light receiving portion and voltages applied to the two main electrodes and at least one of the gates. Therefore, the semiconductor optoelectro transducer of the present invention is operable at high speed and with high sensitivity.

BRIEF DESCRIPTION OF THE DRAWINGS

FIG. 1 is sectional view of a conventional photo detector;

FIG. 2(A) is a sectional view of a photo detector illustrating an embodiment of the present invention;

FIG. 2(B) is its top plan view;

FIGS. 13(A) and (B) are graphs showing the anode current $I_A$-anode voltage $V_{AK}$ characteristics incident on the device of FIG. 12;

FIGS. 14(A), 14(B), 14(C), 14(D), and 14(E) are diagrams illustrating other embodiments of the semiconductor optoelectro transducer of the present invention in which a capacitor is connected to the gate;

FIGS. 15(A), 15(B), 15(C), and 15(D) are diagrams illustrating other embodiments of the semiconductor optoelectro transducer of the present invention in which a capacitor is connected to the drain or source;

FIGS. 16(A), 16(B), 16(C), and 16(D) are diagrams illustrating other embodiments of the semiconductor optoelectro transducer of the present invention in which a resistor and a capacitor are connected to the gate;

FIGS. 17(A) and (B) are diagrams illustrating other embodiments of the semiconductor optoelectro transducer of the present invention in which the gate is made floating;

FIGS. 18(A) and (B) and 19(A) and (B) are diagrams illustrating the arrangements of the semiconductor optoelectro transducers of the present invention shown in FIGS. 14 and 15.

PREFERRED EMBODIMENTS OF THE INVENTION

Figure 3:
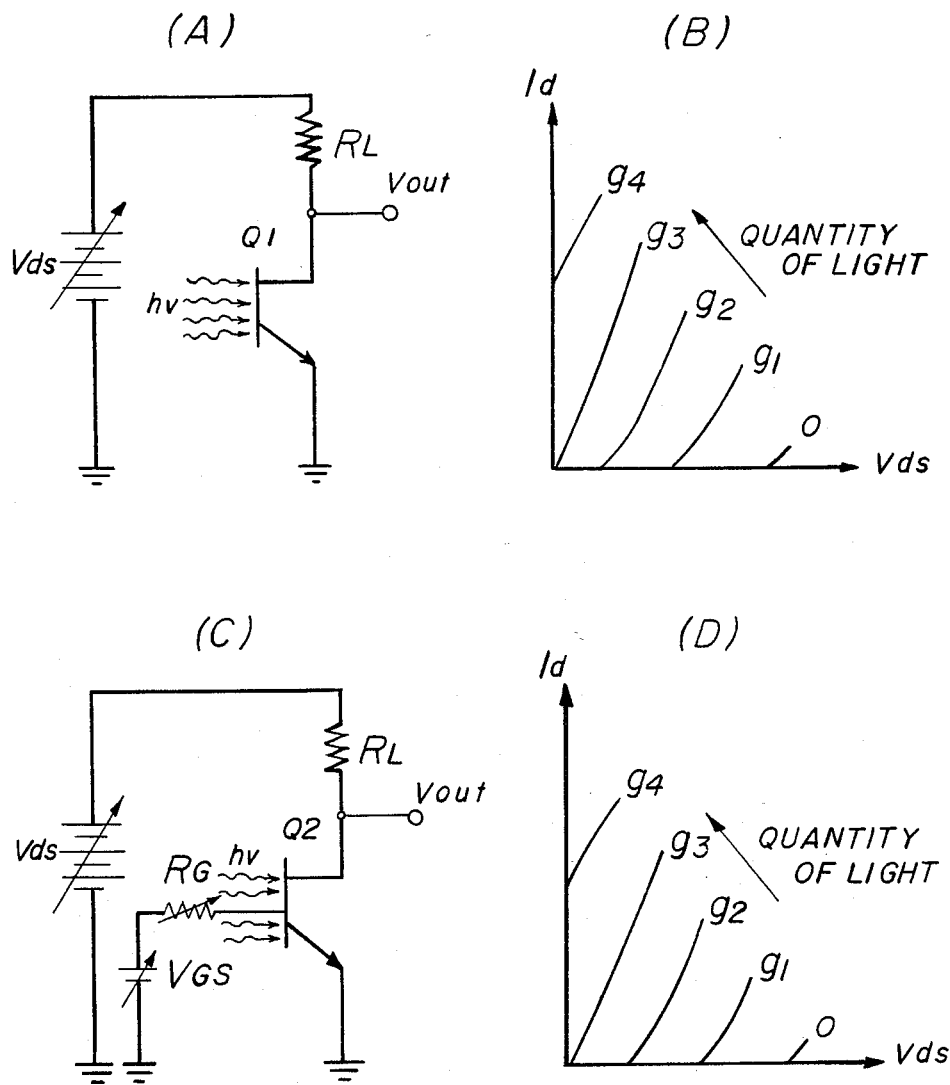
FIGS. 3(A), 3(B), 3(C), 3(D), 3(E), and 3(F) are diagrams showing the operation of the semiconductor optoelectro transducer of the present invention and its drain current Id-drain voltage Vds characteristics when light is incident.
Figure 3:
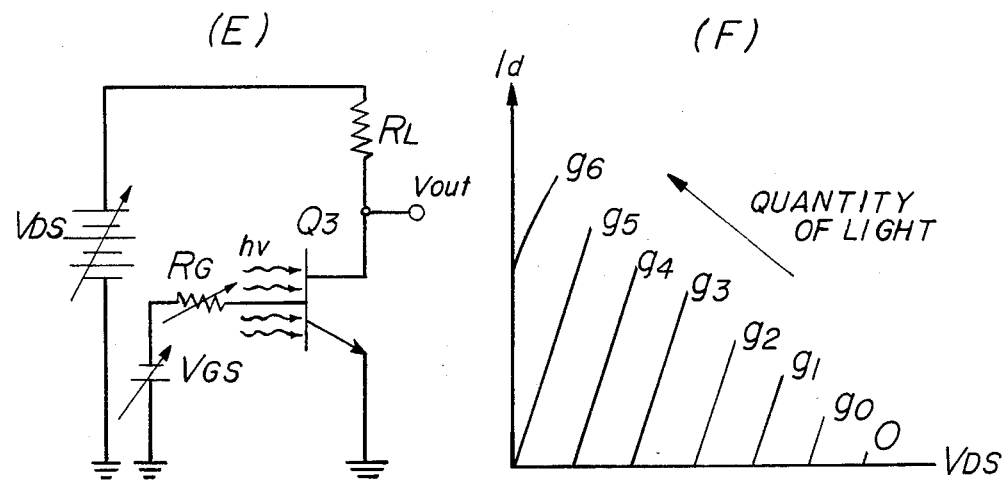

FIG. 2(A) shows, in section, an embodiment of the semiconductor optoelectro transducer of the present invention.

An $n^-$-type epitaxial layer 21 is grown about 30 μm thick on an $n^+$ silicon substrate 20. On the epitaxial layer an $SiO_2$ layer is formed by thermal oxidation, which is selectively etched away through a photo resist mask to expose regions 22 in which are formed gates and then, by selective diffusion of boron into the regions, $p^+$ gate regions are partially formed. Next, a source region 23 of an $n^+$ layer is formed intermediate between adjacent ones of the gate regions through the selective diffusion method as is the case with the gates. Then aluminum is vacuum-evaporated on top and bottom surfaces of the substrate assembly and the aluminum layer, except on the gate and source regions on the top surface, is removed by selective etching by using a mask to form gate and source electrodes 24 and 25. The entire area of the underside of the $n^+$ substrate serves as a drain electrode 26. The arrows indicate incident light having an energy $h\nu$.

FIG. 2(B) is a top plan view of the semiconductor optoelectro transducer of FIG. 2(A). The gate electrodes are linear and connected together at one end to form a region 30 for wiring. Also source electrodes are similarly wired by metal to provide a region 32 for wiring. The gates and sources can also be provided in a mesh form as is well-known in SIT technology. In order that the transistor shown in FIG. 2(A) may operate as an SIT, the impurity density of the n layer of the channel is selected, for example, to be lower than $10^{16}$ cm$^{-3}$, the impurity density of the $p^+$ gate regions to be approximately $10^{17}$ to $10^{21}$ cm$^{-3}$ and the impurity densities of the source and drain regions to be around $10^{17}$ to $10^{21}$ cm$^{-3}$.

The channel layer is a region which determines the voltage to be applied and the photo sensitivity etc. It is desirable that a region absorbing incident light be mostly depleted, permitting most of holes created by the incident light to reach the gate regions; in the case of the present invention, since the gate regions are disposed in the surface of the substrate assembly, the effect of storing the holes in the gates is markedly heightened as compared with the hole storage effect in the case of the semiconductor optoelectro transducer using the conventional buried type SIT.

In the case of the SIT, in order to prevent flowing of much current in the zero gate bias condition, the spacing of $p^+$-type gate mesh regions is selected so that depletion layers resulting from the diffusion potential of the pn junction may overlap to set up a sufficient potential barrier in the channel. For instance, in the case where the impurity density of the $n^-$-type layer forming the channel is $1 \times 10^{14}$ cm$^{-3}$, the impurity density of the gate region is selected higher than $10^{18}$ cm$^{-3}$ and the mesh spacing is selected to be smaller than about 5 μm. The $n^+$-type substrate is not subject to severe limitations but a substrate having an impurity density of $10^{18}$ to $10^{20}$ cm$^{-3}$ is employed. For widening the dynamic range of the output voltage, it is also preferable to lower the impurity density of the $n^-$-type layer 21 and to raise the voltage applied. When the wavelength of light to be detected increases to give rise to the reduction of the absorption coefficient, the thickness of the $n^-$-type layer 21 can be increased.

In order to facilitate current flow even when the voltage between the gate and the source is zero, the gates may preferably be spaced wide apart to prevent depletion of the entire region of the channel.

FIGS. 3(A) and (B) are explanatory of the operation of an embodiment of the semiconductor optoelectro transducer of the present invention, which is formed as the floating gate type with no bias source present between the gate and the source.

$Q_1$ is the semiconductor device of the present invention, $V_{DS}$ is a drain-source voltage source and $R_L$ a load resistor. The semiconductor device $Q_1$ is irradiated by light having the energy $h\nu$. Its I-V characteristic is depicted in FIG. 3(B), which shows that when the quantity of light is zero, no current flows and when the quantity of light increases up to $g_1$, $g_2$, $g_3$ and $g_4$, a drain current flows, producing, across the load resistor $R_L$, an output voltae Vout corresponding to the light. This operation is based on the fact that electron-hole pairs are created by the incident light and holes are absorbed by the $p^+$ region of the gate to charge it positively to produce a forward voltage between the gate and the source, resulting in a source-to-drain current flow.

FIGS. 3(C) and (E) respectively illustrate other embodiments of the semiconductor optoelectro transducer of the present invention in which a forward voltage source and a reverse voltage source are connected via a gate resistor $R_G$. $V_{GS}$ is a voltage source between the gate and the source, and $R_G$ is a gate resistor which is provided for selecting a desired resistance value from zero.

When the gate-source voltage in FIG. 3(C) is forward, a normally OFF type SIT $Q_2$ may also be used. The principle of operation is as follows: Electron-hole pairs created by the light $h\nu$ applied to the channel in the vicinity of the gate, flow from the gate to the source. Due to this, the potential at an intrinsic gate point where the potential barrier against electrons is the highest in the channel, is lowered. This permits an abrupt flow of the electrons from the source region to the drain. As shown in FIG. 3(D), an increase in the quantity of light from zero to $g_1$ to $g_4$ causes an increase in the drain current, thus producing amplification of the light current. As this time, by changing the value of the gate resistor $R_G$, the sensitivity can be adjusted.

FIG. 3(E) illustrates the semiconductor optoelectro transducer of the present invention in which the gate-source path is biased in the reverse direction. To this end, a normally ON type SIT $Q_3$ may also be used. Of electron-hole pairs generated by light having the energy $h\nu$ in the channel, with the gate bias reversely increased and with no drain current flowing, holes are immediately absorbed by the gate electrode to cause the gate current to flow and the resulting voltage drop across the gate resistor $R_G$ causes the voltage between the gate and the source to go positive, abruptly increasing the drain current to carry out the amplification of the input light current. The I-V characteristic of FIG. 3(F) shows how the drain current increases when the quantity of light increases from zero to $g_1$ to $g_6$. It is also possible to change the photo sensitivity characteristic by changing the drain voltage to $V_{D1}$, $V_{D2}$ and $V_{D3}$.

In the static induction transistor, a depletion layer is formed to extend from the gate to the channel and, depending on the manner of forming the depletion layer, the normally OFF type and the normally ON type I-V characteristic can be obtained. By controlling the gate spacing, the gate thickness and the impurity density of the channel, a desired I-V characteristic can be freely obtained. The operating characteristics of FIGS. 3(A) to (F) can be selected according to the purpose of use of the semiconductor optoelectro transducer of the present invention.

While in respect of FIGS. 3(A) through (F) the SITs $Q_1$ to $Q_3$ are described to be n-channel SITs, it is a matter of course that a similar semiconductor optoelectro transducer can be obtained even with a p-channel SIT. In the case of the SIT, since the drain current exponentially increases with the gate voltage, a very high light amplification factor can be achieved. With the semiconductor optoelectro transducer of the present invention, it is therefore possible to easily obtain an amplification factor above 1000 times which is unobtainable with the conventional bipolar type photo transistor. Moreover, since the resistance of the p+ gate of the SIT is low, the operating characteristic can be varied over a wide range by the gate resistor $R_G$ connected to the outside. Besides, by decreasing the capacitance of the gate region, the response speed can be raised, and the sensitivity can be adjusted by the value of the gate resistor $R_G$. In addition, the SIT has a relatively high resistance region, such as the channel region, and hence possesses the advantage that dark current noise can be made low.

By changing the drain voltage source $V_{DS}$ shown in FIG. 3, the load curve can be changed. By changing the drain voltage source, very intense light can be measured within a limited range of the drain current. It is a feature which is unobtainable with the photo transistor exhibiting a saturation type characteristic, that the sensitivity can be raised by increasing the drain voltage. Since the transition frequency $f_T$ of the SIT can easily be raised to 1 GHz without the necessity of appreciable reduction of its size, and since its frequency characteristic does not depend on its area, a very high-sensitivity and very high-speed semiconductor optoelectro transducer can be obtained. The present invention Thus has very excellent features which are unobtainable with the photo transistor formed by an ordinary bipolar transistor.

The present invention is also applicable, of course, to a conventional FET having the saturation type current-voltage characteristic.

Figure 4:
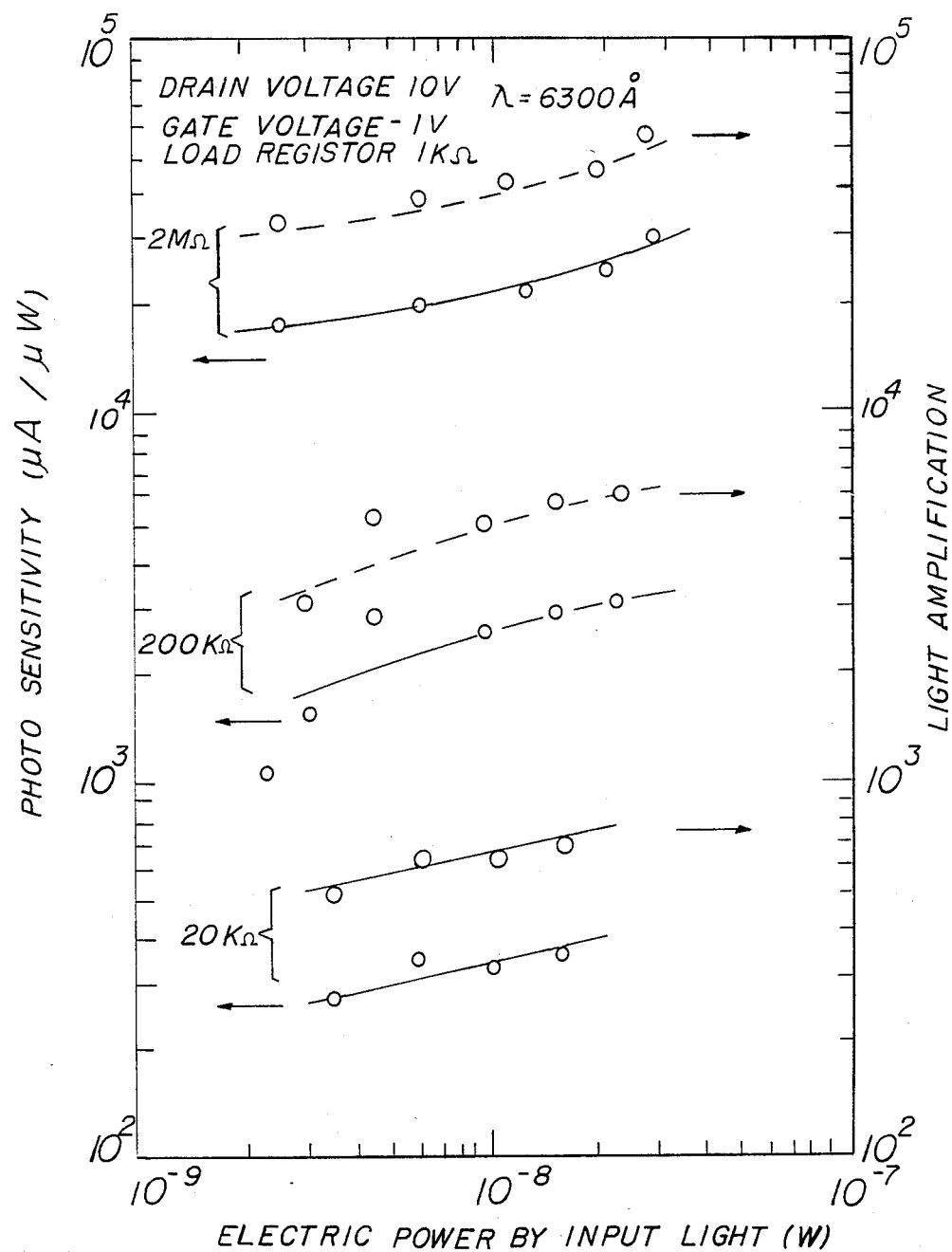
FIG. 4 is a graph showing the photo sensitivity characteristic of the semiconductor optoelectro transducer of another embodiment of the present invention with respect to the optical power by input light.

FIG. 4 shows the relationships between the optical power by input light, the photo sensitivity and the light amplification factor which were obtained with an SIT of the same planar gate type SIT structure as in the embodiment of FIG. 2. Resistance values of 20 K$\Omega$, 200 K$\Omega$ and 2 M$\Omega$ of the gate resistor $R_G$ were used as parameters. When the gate resistor $R_G$ has the value 2 M$\Omega$, the photo sensitivity is $10^4$ ($\mu A/\mu W$) or above.

The conventional photo transistor such as the bipolar transistor, is usually reported to provide a photo sensitivity of about $10^2$ when the input light is several nW, and it has the feature that the photo sensitivity abruptly drops as the intensity of the input light decreases. In the case of the SIT, there is obtained such a characteristic that even when the optical power by the input light is about several nW, the output sensitivity is appreciably flat with respect to the optical power by the input light as seen from the measured results shown in FIG. 4. This indicates that the SIT is an improvement over the conventional photo transistor. In this case, even if the source and drain are reversed, a similar light amplification characteristic can be obtained.

Figure 5:
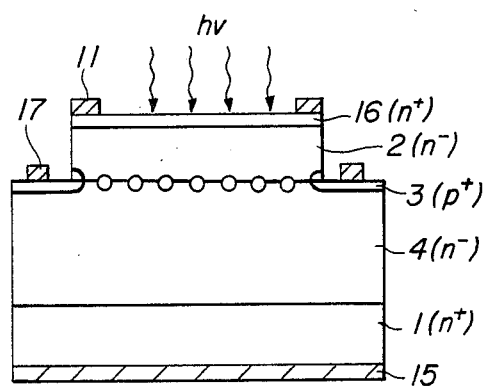
FIG. 5 is a sectional view of another embodiment of the present invention.

FIG. 5 illustrates another embodiment of the present invention.

A conventional SIT photo transistor is irradiated by light from the side of the drain but this embodiment has the structure that it is irradiated by light from the side of the source, and has the advantage that the light easily reaches the gate region.

Reference numeral 1 indicates an n+ substrate of silicon and 4 a high resistance n− layer, which is epitaxially grown on the substrate. Reference numeral 3 denotes a p+ gate region provided in a linear or mesh form by selective diffusion through silicon dioxide. Reference numeral 2 indicates an n− high resistivity layer in which to bury the gate portion and which is formed by epitaxial growth. Reference numeral 16 designates a source, which is formed by n+ diffusion. For example, by chemical etching down to the region for the gate, with the source 16 masked by silicon dioxide, the p+ region 3 of the gate is partly exposed. Aluminum is vacuum-evaporated on both top and bottom surfaces of the wafer. The aluminum on the top surface is selectively etched away to form source and gate electrodes 11 and 17. The aluminum evaporated on the underside of the substrate serves as a drain electrode 15.

As an element protecting film, a CVD silicon dioxide film thin enough not to impair the penetration characteristic of light may also be deposited over the entire area of the wafer surface at the end. A transparent electrode may also be used as the source electrode.

Figure 6:
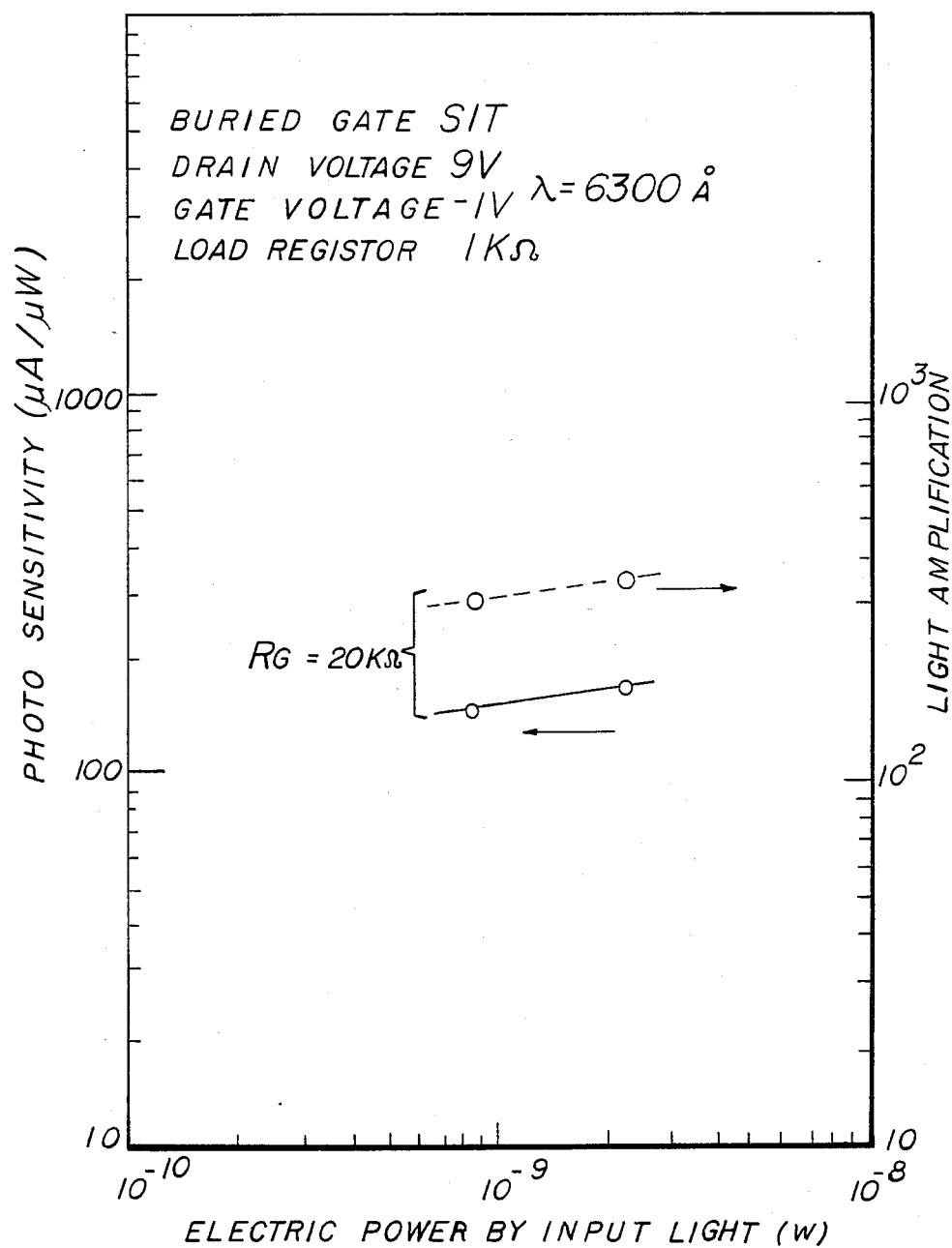
FIG. 6 is a graph showing the photo sensitivity characteristic of the semiconductor optoelectro transducer of another embodiment of the present invention.

FIG. 6 shows the light output characteristic of the semiconductor optoelectro transducer of the embodiment of the present invention which has the source disposed on the side of the wafer surface and employs the buried gate SIT.

For 1 nW optical power by input light, a sensitivity higher than $10^2$ ($\mu A/\mu W$) was obtained when the gate resistor $R_G = 20$ K$\Omega$, and the tendency that the sensitivity further increased was an increase in the resistance $R_G$ was observed as in the case of the planar gate SIT of FIG. 2.

Figure 7:
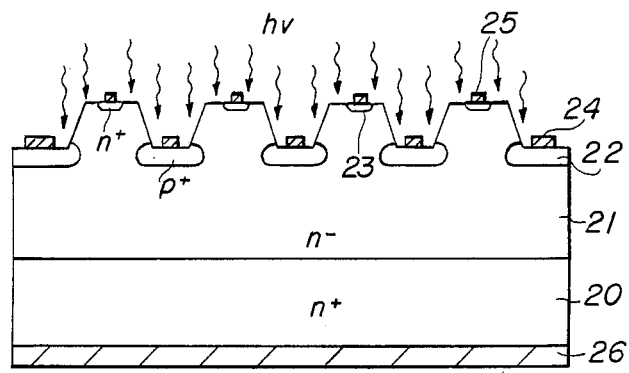
FIGS. 7 and 8 are sectional views of other embodiments of the present invention.

FIG. 7 illustrates another embodiment of the present invention.

This embodiment has the recessed gate structure for improving the response speed. An n− high resistivity layer 21 is formed by epitaxial growth on an n+ substrate 20 of silicon and, after selective etching of silicon dioxide, the n⁻ high resistivity layer 21 is selectively etched away by plasma etching or chemical etching to form recesses to extend down to the regions in which gates are to be formed. Next, P+ regions 22 of high impurity density are formed by selective diffusion of boron, which is followed by selective diffusion of phosphorus or arsenic into the top surface of the n⁻ high resistivity layer at predetermined positions to form n+ regions 23 of high impurity density which will serve as source regions. Aluminum is vacuum-evaporated on both top and bottom surfaces of the wafer and then the aluminum on the top surface is removed by selective etching, leaving only gate and source electrodes 24 and 25. The aluminum on the underside of the substrate will serve as a drain electrode 26.

The semiconductor optoelectro transducer of this structure exhibits advantages over the foregoing embodiments of the present invention in that the light well reaches the channel to increase the light receiving area, and that the electrostatic capacitance between the gate and the source decreases to provide for improved frequency characteristic.

Figure 8:
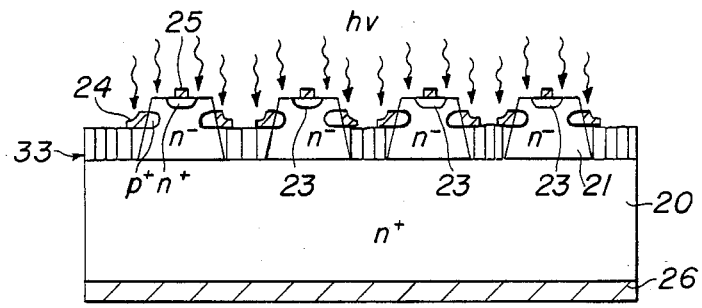

FIG. 8 illustrates another embodiment of the present invention.

Reference numerals and characters or FIG. 8 correspond to those in FIG. 7. The p+ gate regions 22 are each formed in the side wall of a recess cut in the n⁻ high resistivity layer 21 to extend down to the n+ substrate 20. The p+ gate regions 22 are formed, for example, by selective etching down to the n+ drain substrate 20 through plasma or chemical etching after the formation of the p+ gate regions 22 described above in connection with FIG. 7. Next, an insulator 33, such as, for instance, $SiO_2$ or $Si_3N_4$, is deposited to extend to the side of the drain 20 of each p+ gate region 22. Then aluminum is vacuum-deposited on both surfaces of the wafer to form the source, gate and drain electrodes 25, 24 and 26.

The semiconductor optoelectro transducer of this structure has the advantage that the electrostatic capacitance between the gate and the drain is further reduced than in the embodiment of FIG. 7 to provide for improved frequency characteristic.

Figure 9:
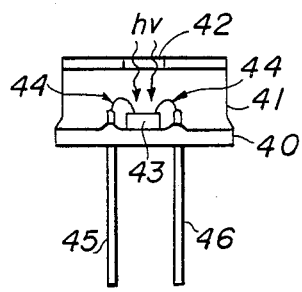
FIGS. 9 and 10 are diagrams illustrating other embodiments of the semiconductor optoelectro transducer of the present invention in which light is directed to an envelope (package case) of the transducer.
Figure 10:
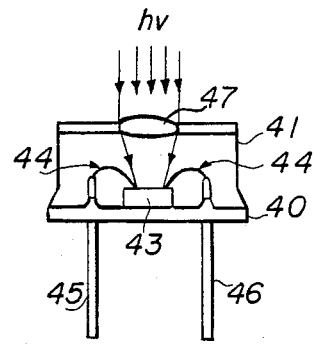

FIGS. 9 and 10 illustrate another embodiment of the present invention.

In this example, the semiconductor optoelectro transducer 44 of the present invention is incorporated in a case which comprises a cap 41 having a window 42 and a stem 40. Reference numeral 45 indicates a pin of the gate and 46 is a pin of the source, and the stem 40 serves as the drain. The pins 45 and 46 are insulated from the stem 40, and the gate electrode and the source electrode of the semiconductor optoelectro transducer are connected by gold or aluminum lead wires 44 to the pin 45 of the gate and the pin 46 of the source, respectively. The window is made of glass, quartz glass, transparent resin or saphire, and these materials are selectively used in accordance with the incident light used. The window may also be such a lens structure as shown in FIG. 10. Reference numeral 47 indicates the window of the lens structure, which acts to converge the incident light on the operating layer of the semiconductor optoelectro transducer of the present invention as illustrated.

The case 40 need not always be metal as mentioned above but may also be a resin-sealed one or the like employed for ordinary photo diodes and photo transistors if it has a window.

FIGS. 11(A) through (D) illustrate other embodiments of the present invention, in which the static induction thyristor is used as an element for the semiconductor optoelectro transducer.

FIG. 11(A) is an example in which the drain region 1 of the static induction transistor of FIG. 5 is replaced by a p+ anode region 50 which is opposite in conductivity type to a channel 51. Also in FIGS. 11(B) to (D), the n+ drains of the static induction transistors of FIGS. 2(A), 7 and 8 are respectively replaced by p+ anodes to form static induction thyristors.

In FIG. 11(A), a channel region 51 of an n⁻ or intrinsic semiconductor is formed on a p+ silicon substrate having an impurity density of $1 \times 10^{18}$ to $1 \times 10^{19}$ cm⁻³; a mesh-like p+ gate region is formed by selective diffusion through a silicon dioxide film in such a manner as not to close the channel; an n⁻ layer 54 of the channel is formed on the gate region through vapor growth using $SiCl_4$ and $H_2$ gas; a cathode region 55 is formed by diffusion of phosphorus; and aluminum is deposited to form cathode, gate and anode and the cathode at the same time electrodes 57, 56 and 58. In the manufacture, it is also possible to form the anode by diffusion boron into the n⁻ substrate (500 Ωcm) over the entire areas of one side thereof and the gate by selective diffusion of boron into the substrate on the other side thereof.

FIG. 11(B) shows an embodiment in which the p+ gate regions 53 are provided in the wafer surface, FIG. 11(C) is an example in which the gate regions 53 are each formed at the bottom of a recess below the cathode region 55 and, in FIG. 11(D), in order to reduce the stray capacitance between the gate 53 and the anode 50, an unnecessary portion of the channel is recessed down to the anode region 50 and an insulator 59, such as $SiO_2$, is deposited to form the gate electrodes 56.

Figure 11:
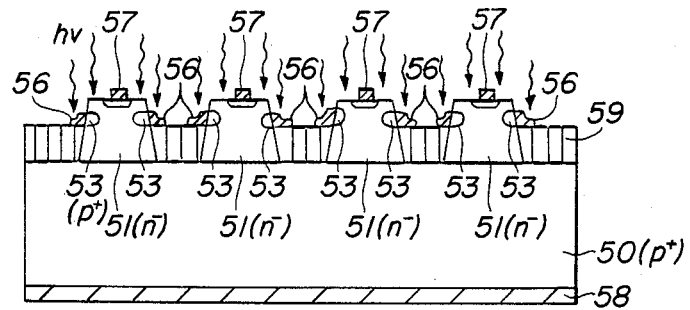
FIGS. 11(A), 11(B), 11(C), and 11(D) are sectional views of static induction thyristors embodying the semiconductor optoelectro transducer of the present invention.

The static induction thyristor of FIG. 11 is irradiated by light of the energy hν on the side of the cathode to perform the function of the semiconductor optoelectro transducer.

Figure 12:
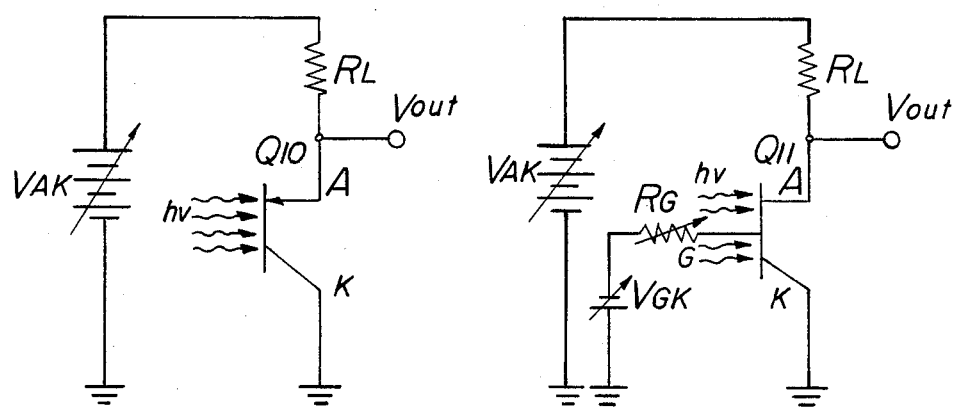
FIGS. 12(A) and (B) are diagrams which are explanatory of the operation of the semiconductor optoelectro transducer shown in FIG. 11.

FIGS. 12(A) and (B) are embodiments showing how to use the semiconductor device of FIG. 11. In FIG. 12(A), the gate is made floating, and $Q_{10}$ is the static induction thyristor, $V_{AK}$ an anode-cathode voltage and $R_L$ a load resistor. Light having the energy hν is applied to the static induction thyristor $Q_{10}$, by which current flows between the anode and the cathode to produce the output Vout. By this, photoelectric conversion is carried out.

FIG. 12(B) shows a static induction thyristor $Q_{11}$ having a reverse bias source and a gate resistor $R_G$ connected between its gate and cathode. The static induction thyristor in this case is the normally ON type and the gate-cathode voltage is made negative to keep a forward block voltage high. When light having the energy hν is applied to the channel, current flows between the gate and the cathode to cause a voltage drop across the gate resistor $R_G$ to reduce the gate-cathode voltage, by which the anode-to-cathode current of the static induction thyristor $Q_{11}$ flows to provide the output voltage Vout, performing photoelectric conversion.

FIGS. 13(A) and (B) are I-V characteristics showing the relationships between the anode current $I_A$ and the anode-cathode voltage $V_{AK}$ when light is applied to the static induction thyristor.

FIG. 13(A) shows the I-V characteristics obtained in the case where the gate-cathode voltage of the normally ON type static induction thyristor was reverse-biased to block the anode voltage up to $V_{AK1}$ and the quantity of light was increased from zero to $g_1$ to $g_6$.

FIG. 13(B) shows the I-V characteristics obtained when the normally OFF type static induction thyristor was irradiated by light.

The illustrated I-V characteristics are those obtained when the quantity of light was increased to $g_1$ to $g_4$ in such a state in which $V_{GK}=0$ V and the anode voltage was blocked up to $V_{AK2}$.

In the semiconductor optoelectro transducers using the above static induction thyristors, the impurity density of the channel is $1 \times 10^{16}$ cm$^{-3}$ or lower and the impurity densities of the p+ layers of the gate and the anode are approximately $1 \times 10^{18}$ cm$^{-3}$. The block voltage in the forward direction is determined by the impurity density and the thickness of the channel layer. With a silicon substrate of high resistance (500 Ωcm) and having a thickness of 300 μm, a block voltage of about 600 V can be obtained.

Another embodiment of the present invention is shown in FIG. 14. FIG. 14(A) is a diagram showing the principle in the case where the semiconductor device of the present invention is used as a light storage cell, and a capacitor is connected to the gate of the static induction transistor. In this case, the semiconductor devices described previously in respect of FIGS. 2 to 13 can be employed. Carriers created by light irradiation in the channel gather in the vicinity of the gate to charge up an electrostatic capacitor of the gate, thereby storing a light signal. FIG. 14(B) illustrates this embodiment. An n− (or intrinsic) layer 61 of high resistance is formed by vapor epitaxial growth on an n+ substrate 60, for example, of silicon and, by selective diffusion through a silicon dioxide film, p+ gate regions 62 of high impurity density and high impurity density regions 63 which will ultimately form sources, are formed. Reference numeral 65 indicates a material which forms a capacitor on the gate and which is dielectric, such as $SiO_2$, $Si_3N_4$ or the like, and 66 denotes metal electrodes e.g. of aluminum. Reference numerals 67 and 68 indicate metal electrodes of the source and the drain, respectively. The metal electrodes 67 and 68 may also be formed as drain and source electrodes as shown in FIG. 14(A). Reference numeral 64 indicates a surface protecting film of silicon dioxide. FIG. 14(C) illustrates another embodiment which is provided with the gate 62 having connected thereto a capacitor and a gate 70 with no capacitor (hereinafter referred to as the floating gate). The gates 62 and 70 can be formed by the same diffusion step. The floating gate 70 is metal-wired and may receive a proper bias, or be made equipotential to the source. The above is the case in which the n+ substrate is used as the source or drain. Next, embodiments using a p substrate are shown in FIGS. 14(D) and (E). In FIG. 14(D), a drain region 72 is formed by diffusion of arsenic in a p substrate 71 doped with boron to a density of about $1 \times 10^{16}$ cm$^{-3}$. On the drain region is formed, by vapor epitaxial growth, the high resistivity n− layer (which may also be an intrinsic semiconductor layer) 61. In order to wire the buried drain region to the wafer surface, an n+ layer 73 is formed by selective diffusion. Thereafter the gate 62 and the source 63 can be formed by the same steps as those in FIG. 14(B). The drain, gate and source electrodes 68, 66 and 67 are formed by aluminum. FIG. 14(E) shows an embodiment for isolating one cell of the embodiment of FIG. 14(D), in which the cell is isolated by diffusion. A p or p+ layer 75 is an isolation region. The cell structure is the same as that in the embodiment of FIG. 14(D). The isolation can be achieved not only by a p-n junction but also by an oxide.

The embodiments shown in FIGS. 14(A) to (E) permit storing in the capacitor of the gate region a signal of light having the energy hν. It is a matter of course that the source and drain can be made reverse from those described in the embodiments.

FIGS. 15(A) to (D) illustrate other embodiments of the present invention. FIG. 15(A) shows an example in which the capacitor for storing the signal of light is connected to the source, and FIG. 15(B) an example in which the capacitor for storing the signal of light is connected to the drain.

Reference numerals used in these embodiments correspond to those in FIG. 14. FIG. 15(C) shows an example in which the capacitor is connected to the n+ source region 63, reference numeral 75 indicating n+ doped polysilicon, 76 an oxide film and 67 an aluminum electrode. The polysilicon 75, the oxide film 76 and the aluminum electrode 67 constitute the capacitor. A metal electrode 66 is formed on the p+ layer of the gate.

FIG. 15(D) shows an embodiment in which the capacitor connected to the drain, shown in FIG. 15(B), is provided on the p substrate. Reference numeral 75 indicates polysilicon, 76 an oxide film and 68 a drain electrode, by which the capacitor is constituted.

In FIGS. 15(C) and (D) the source and the drain may be reversed. The material for the capacitor is not limited specifically to the silicon oxide film but may also be an $Si_3N_4$, $Al_2O_3$ or like film.

Another embodiment of the present invention is shown in FIGS. 16(A) to (D). FIG. 16(A) shows an example in which a capacitor and a resistor are connected in parallel to the gate of the static induction transistor, and FIG. 16(B) shows another example in which a capacitor and a resistor are similarly connected in series to the gate. The both examples are intended for storing the light signal for the time determined by the time constant dependent on the values of the capacitor and the resistor. When the resistance value is large, the capacitor may also be omitted. Also it is possible that a capacitor having connected thereto a resistor in series or in parallel is connected to the source or drain.

FIG. 16(C) shows another embodiment in which a capacitor and a resistor are connected in parallel to the gate.

Reference numeral 77 indicates a resistor of for example, boron-doped polysilicon, 78 a dielectric thin film as of silicon dioxide and 66 a metal electrode, by which the capacitor and the resistor are connected to the gate region 62.

FIG. 16(D) shows another embodiment of the present invention corresponding to FIG. 16(B). Reference numeral 80 indicates boron-doped polysilicon, which serves as a resistor, 81 a dielectric thin film as of silicon dioxide, and 66 a metal electrode. The polysilicon 80, the dielectric thin film 81 and the metal electrode 66 constitute a resistor and a capacitor which are connected in series to the gate region 62.

The resistor and the capacitor can be formed not only by the abovesaid members but also by phosphorus-doped polycrystals, a p-n junction, $Si_3O_4$, $Al_2O_3$ films.

FIGS. 17(A) and (B) illustrate another embodiment of the present invention, in which the gate is held floating.

FIG. 17(A) shows an example in which the gate is given no metal wiring in the embodiment of FIG. 14(B).

FIG. 17(B) shows an example in which the gate is given no metal wiring in the embodiment of FIG. 14(D).

For the semiconductor optoelectro transducers of FIGS. 14 to 17, the static induction thyristor as well as the SIT can be employed.

FIGS. 18(A) and (B) illustrate another embodiment of the present invention.

FIG. 18(A) shows an example of the connection of the optoelectro transducers of the present invention illustrated in FIG. 14. $Q_{20}$ is the semiconductor optoelectro transducer of the present invention in which a capacitor is connected to its gate. The gates, sources and drains of the semiconductor optoelectro transducers arranged in two dimensions are respectively connected to lines $b_1, b_2, \ldots$, lines $a_1, a_2, \ldots$ and lines $c_1, c_2, \ldots$. For instance, in the case of the static induction transistor of FIG. 14(B), since the $n^+$ substrate is used as the drain or source, the drains and sources may be connected to common lines. When the substrate is used as the drain, the source and the gate are wired on the surface side of the substrate. FIG. 18(B) shows an example in which the source and the drain in FIG. 18(A) are reversed in position. In this embodiment, upon irradiation by light having the energy $h\nu$, photoelectric conversion is carried out by the cells arranged in two dimensions. Since the cells are each formed by one static induction transistor and are high in optical amplification factor, this semiconductor optoelectro transducer possesses the great advantages of high sensitivity and simple construction over a photosensor using a diode and a CCD, or a diode and a MOS transistor. A storing time for the photo signal in the gate about one second can sufficiently be obtained.

FIGS. 19(A) and (B) illustrate other embodiments of the present invention in which a capacitor is connected to the source and in which a capacitor is connected to the drain, respectively. $Q_{21}$ is the semiconductor device of the present invention shown in FIG. 15.

As the semiconductor devices in both of the embodiments of FIGS. 18 and 19, the cells shown in FIGS. 2 to 17 can be used.

The two-dimensional interconnection can be carried out by methods known for conventional random access memories, such as a low-layer interconnection or a metal interconnection using polysilicon for the one electrode and aluminum for the other electrode.

While in FIGS. 18 and 19 are shown the semiconductor optoelectro transducer of the present invention in which a capacitor is connected to the gate, source or drain, it is also possible to combine it with the semiconductor optoelectro transducer of FIG. 16 or any of those in FIGS. 14 to 16 into one cell.

Figure 20:
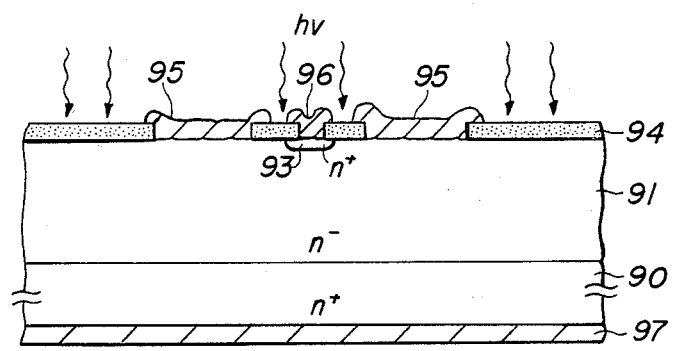
FIG. 20 is a diagram illustrating another embodiment of the semiconductor optoelectro transducer of the present invention which employs a Shottky barrier gate.

FIG. 20 illustrates another embodiment of the present invention, in which the gate is formed not by a $p^+$ layer but by a Schottky barrier one.

Reference numeral 90 indicates an $n^+$ substrate of silicon, 91 a high resistivity $n^-$ layer (which may also be an intrinsic semiconductor layer), 93 a high impurity density $n^+$ layer to be formed as the source, 94 a surface protective film, 95 a metal which forms a Schottky barrier against silicon, such as platinum and molybdenum, and 96 and 97 metal electrodes of the source and the drain. The Schottky barrier gate can be employed in place of not only the planar gate structure but also the $p^+$ gate in the embodiments described previously in respect of FIGS. 2 to 19.

In the embodiments described in the foregoing, when the gate is made floating, the minority carriers created by light irradiation in the channel are stored in the gate region of the reverse conductivity type. If the gate region is held floating, stored charges are erased only through a leak resistor, so that the response speed is lowered.

The stored charges can be positively discharged by connecting a conducting path between the gate region and the source region. In the case where a resistor is connected, the response speed is determined by the value of capacitor of the gate region and the value of the resistor of the gate region. This resistor can be formed by diffusion or the like in the same semiconductor chip.

When switching means is connected as the conducting path, the response speed is dependent on the intermittent frequency of switching means. In this case, charges are stored during the OFF period of the switching means, so that when it is desired to raise the sensitivity in preference to the response speed, it is sufficient to lengthen the OFF period of the switching means. The switching means may also be formed by a transistor or the like in an integrated form on the same semiconductor chip, or formed by a mechanical chopper or the like and off-chipped.

The structure of the light receiving portion is not limited specifically to those used in the foregoing embodiments.

For example, the light receiving portion may be formed on the side of the source or drain or at any other places where light can sufficiently be introduced into the active region while in operation.

Such electrode structure as in the foregoing embodiments in which the electrodes are disposed on the side of the light receiving surface is not limited specifically to the illustrated ones, either. The electrodes may be formed in stripe or meshy pattern, or a transparent electrode may also be provided over the entire area of the light receiving surface.

The semiconductor optoelectro transducer of the present invention can be made for color use by mounting an organic filter or a multilayer film of $SiO_2$, $SiN_3$ and the like such as proposed by the present inventor in Pat. Appln. No. 101179/78, on the light illuminated region in each embodiment of the semiconductor optoelectro transducer of the present invention.

For the manufacture of the cells, it is possible to use, instead of diffusion, known semiconductor manufacturing methods, such as ion implantation, CVD for forming an insulating film, plasma etching, anodization and sputtering for film formation.

The semiconductor material used is not limited to silicon and, for measurement of long wavelength light, semiconductors of small energy gap (for instance, Ge, $Po_{1-x}Sn_xTe(S, Se)$, $Hg_{1-x}Cd_xTe$, InSb and so forth) can be used. For measurement of shorter wavelength light, semiconductors of large energy gap (for instance GaAs, Gap and so forth) can be used. In addition, the conductivity types mentioned in the foregoing may all be reversed.

The semiconductor optoelectro transducer of the present invention employs a static induction transistor, a static induction thyristor or a field effect transistor as a photosensor and takes out the intensity of incident light as an electric signal. The semiconductor optoelectro transducer of the present invention includes such cells as shown in FIGS. 2, 5 to 8, 11 and 14 to 20 and such devices as shown in FIGS. 3, 9, 10, 12 and 13 which have incorporated therein the inventive cells.

The semiconductor optoelectro transducer of the present invention has the advantages of low noise and high sensitivity, and is of great industrial value.

I claim:

1. A semiconductor optoelectro transducer comprising:
   a high-resistivity semiconductor region of a first conductivity type having an impurity concentration on the order of $1 \times 10^{14}$ cm$^{-3}$ to $1 \times 10^{16}$ cm$^{-3}$ and predetermined dimension constituting at least one current channel having two ends;
   a pair of current electrode means comprising low-resistivity semiconductor regions of said first conductivity type and connected to said two ends of said current channel for receiving a main voltage from an external voltage source;
   control electrode means formed adjacent and surrounding said current channel for controlling current between said current electrode means, said control electrode means including a low-resistivity semiconductor storage region of a second conductivity type opposite to said first conductivity type and having a low resistivity as compared to the resistivity of said high-resistivity region and formed adjacent said current channel, said control electrode means being capable of storing charge carriers of the second conductivity type and thereby varying a potential thereof to control current between said current electrode means;
   a resistor connected to said control electrode means for controlling photosensitivity;
   light receiving means formed in the area of said current channel for introducing external light at least into part of said semiconductor region; and
   at least one depletion layer formed in said semiconductor region extending from said control means to selectively pinch off said current channel due to said impurity concentration and predetermined dimensions, and forming a potential barrier in said current channel having a height in accordance with the potential of one of said current electrode means;
   said current electrode means and said current channel being configured substantially perpendicular with respect to said semiconductor region.

2. A semiconductor optoelectro transducer comprising:
   a high-resistivity semiconductor region of a first conductivity type having an impurity concentration on the order of $1 \times 10^{14}$ cm$^{-3}$ to $1 \times 10^{16}$ cm$^{-3}$ and predetermined dimensions constituting at least one current channel having two ends;
   first current electrode means comprising low-resistivity semiconductor regions of said first conductivity type and connected to one of said two ends of said current channel for receiving a main voltage from an external voltage source;
   second current electrode means comprising low-resistivity semiconductor regions of a second conductivity type opposite to said first conductivity type and connected to one of said two ends of said current channel for receiving a main voltage from an external voltage source;
   control electrode means formed adjacent and surrounding said current channel for controlling current between said current electrode means, said control electrode means including a low-resistivity semiconductor storage region of said second conductivity type and having a low resistivity as compared to the resistivity of said high-resistivity region and formed adjacent said current channel, said control electrode means storing charge carriers of said second conductivity type and thereby varying the potential thereof to control current between said current electrode means;
   a resistor connected to said control electrode means for controlling a photo sensitivity;
   light receiving means formed in the area of said current channel for introducing external light at least into part of said semiconductor region; and
   at least one depletion layer formed in said semiconductor region extending from said control means to selectively pinch off said current channel due to said impurity concentration and predetermined dimensions, and forming a potential barrier in said current channel having a height in accordance with the potential of said control means and the potential of one of said current electrode means;
   said current electrode means and said current channel being configured substantially perpendicular with respect to said semiconductor region.

* * * * *